(12) United States Patent
Lam et al.

(10) Patent No.: US 6,243,020 B1
(45) Date of Patent: Jun. 5, 2001

(54) METHOD AND APPARATUS FOR PROGRAMMABLY DRIVING AN LED DISPLAY

(75) Inventors: Ian Lam, Daly City; Philip Simmons, San Jose; Denise Kerstein, Mountain View, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 08/992,918

(22) Filed: Dec. 18, 1997

Related U.S. Application Data
(60) Provisional application No. 60/038,025, filed on Feb. 14, 1997.

(51) Int. Cl.[7] .................................................. G08B 5/00
(52) U.S. Cl. .................................. 340/815.4; 340/815.69; 340/635; 345/84
(58) Field of Search .......................... 340/815.4, 815.45, 340/635, 815.69; 345/55, 82, 83, 84, 85

(56) References Cited

U.S. PATENT DOCUMENTS

| | | | |
|---|---|---|---|
| 4,887,074 | * 12/1989 | Simon | 340/782 |
| 5,138,310 | * 8/1992 | Hirane | 340/811 |
| 5,432,497 | * 7/1995 | Briski | 340/525 |
| 5,515,376 | 5/1996 | Murthy et al. . | |
| 5,845,235 | * 12/1998 | Luukkanen | 702/127 |
| 5,895,565 | * 4/1999 | Steininger | 210/85 |
| 6,169,491 | * 1/2001 | McDonald | 340/815.4 |

* cited by examiner

*Primary Examiner*—Jeffery Hofsass
*Assistant Examiner*—Anh La

(57) ABSTRACT

A method and apparatus for programmably driving a light-emitting diode(LED) display stores a display configuration in a register. The register contains the information identifying for which conditions in the system will status information be provided to LED drivers. When used in a system such as an Ethernet network multiport switch, for example, the status information for only those conditions and those ports identified by the display configuration stored in the configuration register will be displayed, even though status is collected for more conditions in the system.

22 Claims, 8 Drawing Sheets

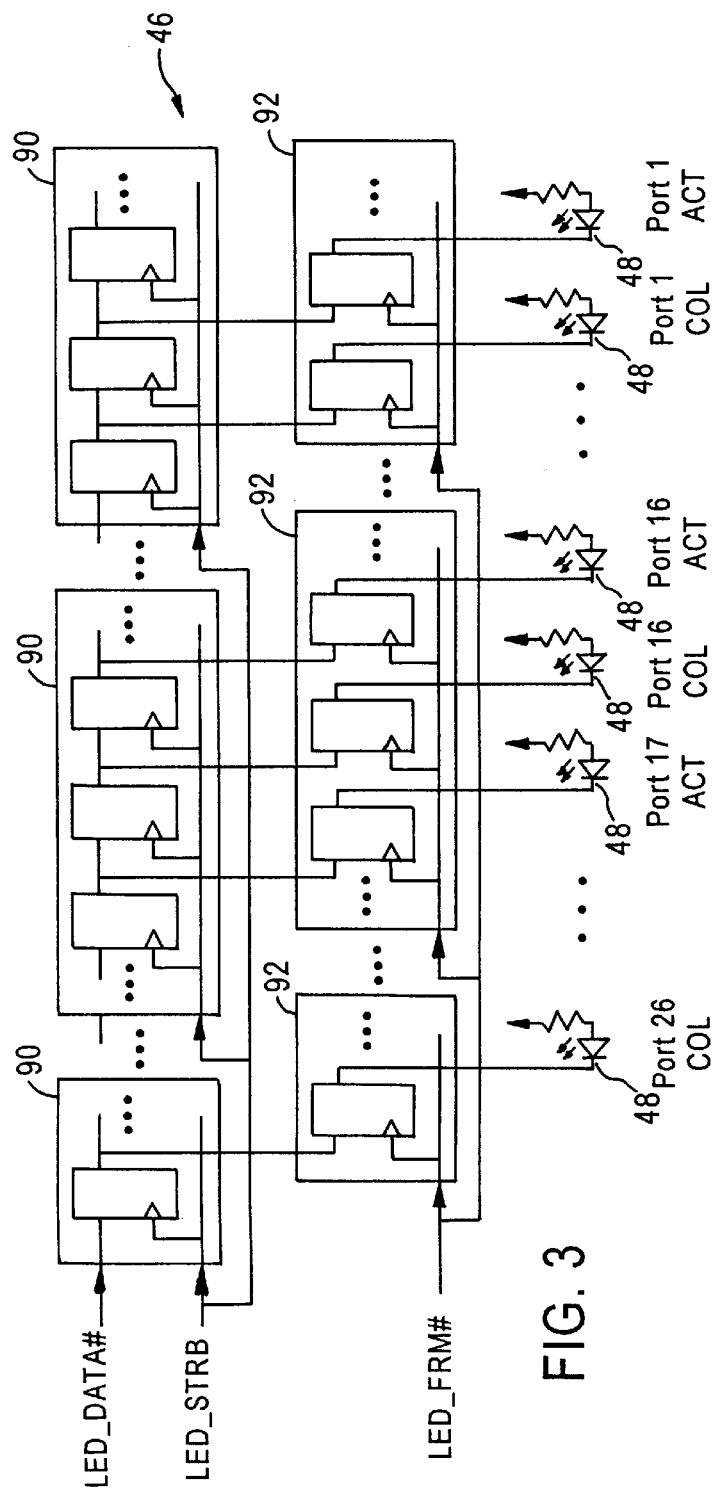
FIG. 3
FIG. 4

| Bit(s) | Name | Description |
|---|---|---|
| 31 | FRMPOL | LED_FRM Polarity: 1 = LED_FRM# is active high, 0=LED_FRM# is active low |
| 30-24 | RES | Reserved (writes are ignored: reads return 0) |
| 23 | FDLED100 | Full-Duplex LED: strobe out LED data for FD on all 100 Mb/s ports (Ports 25-26) |
| 22 | LNKSTLED100 | Link Status LED: strobe out LED data for LNKST on all 100 Mb/s ports (Ports 25-26). |
| 21 | RES | Reserved (writes are ignored: reads return 0) |
| 20 | COLLED100 | Collision LED: strobe out LED data for COL on all 100 Mb/s ports (Ports 25-26). |
| 19 | TXLED100 | Transmit LED: strobe out LED data for TX activity on all 100 Mb/s ports (Ports 25-26). |
| 18 | RXLED100 | Receive LED: strobe out LED data for RX activity on all 100 Mb/s ports (Ports 25-26). |
| 17 | ACTLED100 | Activity LED: strobe out LED data for activity ACT (TX or RX) on all 100 Mb/s ports (Ports 25-26). |
| 16 | EN100LED | Enable LED data output for 100 Mb/s ports. |
| 15-8 | RES | Reserved (writes are ignored: reads return 0) |
| 7 | FDLED10 | Full-Duplex LED: strobe out LED data for FD on all 10 Mb/s ports (Port 0 Mgmt and Ports 1-24). |
| 6 | LNKSTLED10 | Link Status LED: strobe out LED data for GDLNK on all 10 Mb/s ports (Port 0 Mgmt and Ports 1-24). |
| 5 | RXPOLLED10 | Receive Polarity LED: strobe out LED data for RXPOL on all 10 Mb/s ports (Port 0 Mgmt and Ports 1-24). |
| 4 | COLLED10 | Collision LED: strobe out LED data for COL on all 10 Mb/s ports (Port 0 Mgmt and Ports 1-24). |
| 3 | TXLED10 | Transmit LED: strobe out LED data for TX activity on all 10 Mb/s ports (Port 0 Mgmt and Ports 1-24). |
| 2 | RXLED10 | Receive LED: strobe out LED data for RX activity on all 10 Mb/s ports (Port 0 Mgmt and Ports 1-24). |
| 1 | ACTLED10 | Activity LED: strobe out LED data for activity ACT (TX or RX on all 10 Mb/s ports (Port 0 Mgmt and Ports 1-24). |
| 0 | ENTENLED10 | Enable LED data output for the 24 10 Mb/s user ports. |

FIG. 5

METHOD AND APPARATUS FOR PROGRAMMABLY DRIVING AN LED DISPLAY

RELATED APPLICATIONS

This application claims priority from provisional application Ser. No. 60/038,025, filed Feb. 14, 1997, entitled "INTEGRATED MULTIPORT SWITCH", which is incorporated herein by reference.

FIELD OF THE INVENTION

The present invention relates to the field of displaying status information of conditions in a system, and more particularly, to method and apparatus for driving a display having a plurality of discrete display elements, such as an LED display.

DESCRIPTION OF RELATED ART

Many electronic systems, such as data networks, have displays that indicate the status of conditions in the system. In the example of data networks, such as Ethernet networks, the display is used to indicate the status of certain conditions, such as whether there is activity at a certain port of a network switch, whether there is transmit or receive activity at a port, or the indication of a collision of data frames. In other types of systems, such as telephonic communication devices, displays may be used to indicate the status of battery power, the signal strength, activity on the line, etc. One of the most common display devices in electronic systems is a light emitting diode (LED) display.

A relatively complex system, such as a network switch, may have a large number of conditions that are of interest to a user or a manager of the system. For example, in a multiport switch, having n ports, and m different conditions for each of the ports, displaying each of the conditions for each of the ports would require a display of n x m LED elements. An exemplary number of ports is 26 ports, and an exemplary number of conditions are six different conditions when the network switch is an Ethernet network switch, for example. In order to display each of the six different conditions for each of the 26 ports, a total of 156 LEDs would be needed on the front panel of the network switch. Outfitting a switch with such a large number of LED elements would make the front panel unduly large, difficult to read, and unnecessarily expensive.

In most instances, a user or a manager is interested in only a subset of the different conditions of the system. For example, in an Ethernet network, although there may be available status information related to the conditions of the link, full-duplex, receive, transmit, collision, etc., a manager may only be interested in information regarding the collision and the activity on ports of the network. A manager of another network may only be interested in the transmit and receive activity on the network ports. With prior art devices, users and managers are forced to use a network switch that displays information on all of the conditions, which is unreasonable as described earlier, or attempt to purchase a network switch which provides the status of the desired conditions. This quandry made it difficult for a manager or user from employing a switch with a relatively small number of LEDs, but still receive the information regarding the system conditions that the manager or user particularly desires.

SUMMARY OF THE INVENTION

There is a need for a method and apparatus for driving a display, such as an LED display, in a manner that uses a relatively low number of display elements, yet is flexible to display the status of a desired subset of conditions from a plurality of conditions of the system.

This and other needs are met by an embodiment of the present invention which provides a method of driving a display having a plurality of discrete display elements, such as LED display elements. In this method, each display element displays the status of one of a plurality of conditions in the system. The system may be, for example, an Ethernet network switch. Rather than driving the same set of conditions in each switch, the present invention allows the user to identify for which conditions in the system will status be displayed. For example, the user or manager identifies two conditions out of six possible conditions in the system. Rather than displaying the status for all six conditions in the system, only the status for the two identified conditions will be displayed. In a multiport switch, for example, the two conditions selected may be displayed for each of the different ports of the switch, or for a selected subset of the ports of the switch.

The selection of the conditions in the system for which the status is to be displayed is stored as a display configuration. A register in the switch may be used for storing the display configuration, for example. During operation, the status of the plurality of conditions in the system are stored in a memory. However, the status for only those conditions identified by the stored display configuration are retrieved from the memory. The individual display elements are then driven so that each will display the status for a different one of the conditions identified in the stored display configuration. Hence, with the present invention, a smaller number of individual display elements, such as LED elements, are required since a relatively small number of identified conditions are being displayed. Since the user or manager is able to select for which conditions a status is to be displayed, the user is provided with all of the information that user has considered important.

The earlier stated needs are also met by another embodiment of the present invention which provides a multiport switch that receives status information on a plurality of conditions in a packet switched system. The switch comprises a register programmable to store a display configuration identifying the conditions in the system for which the status is to be displayed, and a state machine that collects the status of only the conditions in the system that are identified in the stored display configuration and generates an output data signal comprising the collected status.

The multiport switch of the present invention has the advantage of allowing a user or manager to configure the switch to drive a display to show the status of conditions in which the user or manager is most interested. This customizability of the switch permits a single switch to be used in a variety of differently configured networks, in which the conditions of interest are different from network to network. Furthermore, a lower number of display elements are needed to display the conditions of interest, since display elements are not wasted on conditions that are not of interest. This makes the display smaller, more cost-effective, and more user friendly since it is less complex.

The earlier stated needs are also met by another embodiment of the present invention which provides a packet switched system comprising a plurality of end stations and a multiport switch coupled to the end stations through switch ports. The multiport switch receives status information on a plurality of conditions in the system. The switch includes a register programmable to store a display configuration identifying the conditions in the system for which the status is to be displayed, and a display interface with a state machine that collects the status of only the conditions in the system that are identified in the stored display configuration and generates an output data signal comprising the collected status. A multiple element display is coupled to the display interface to receive the output data signal and generate a display of the status information of the conditions in the system that are identified in the stored display configuration.

The earlier stated needs are also met by another embodiment of the present invention which provides a display arrangement for displaying the status of a selected subset of conditions from a plurality of conditions in a system. The arrangement comprises a register programmable to store a display configuration identifying the conditions in the system for which the status is to be displayed, and a display interface that receives status information on a plurality of conditions in the system. The display interface includes a state machine that collects the status of only the conditions in the system that are identified in the stored display configuration and generates an output data signal comprising the collected status. A multiple element display is coupled to the display interface to receive the output data signal and generate a display of the status information of the conditions in the system that are identified in the stored display configuration.

The display arrangement of the present invention is applicable in any system in which there are a number of conditions for which status information is collected, but programmability to display the status for only a subset of these conditions is desirable. Examples of such systems include Ethernet networks, other types of data networks, telephonic communication systems and devices, computer systems, etc.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 3 is a schematic depiction of the LED external logic employed in the system of FIG. 1, constructed in accordance with an embodiment of the present invention.

FIG. 4 depicts exemplary LED logic signals that convey the LED status information to the LED external logic of FIG. 4.

FIG. 5 displays the contents of a programmable configuration register for the LED external logic of FIG. 4.

DETAILED DESCRIPTION OF ILLUSTRATIVE EMBODIMENTS

The present invention will be described with the example of a switch in a packet switched network, such as an Ethernet network. However, as will become apparent from the description, the present invention is also applicable to other types of systems in which a plurality of conditions of the system are present and may be displayed, but it is desirable to display the status of only a selected subset of these conditions.

Figure 1:
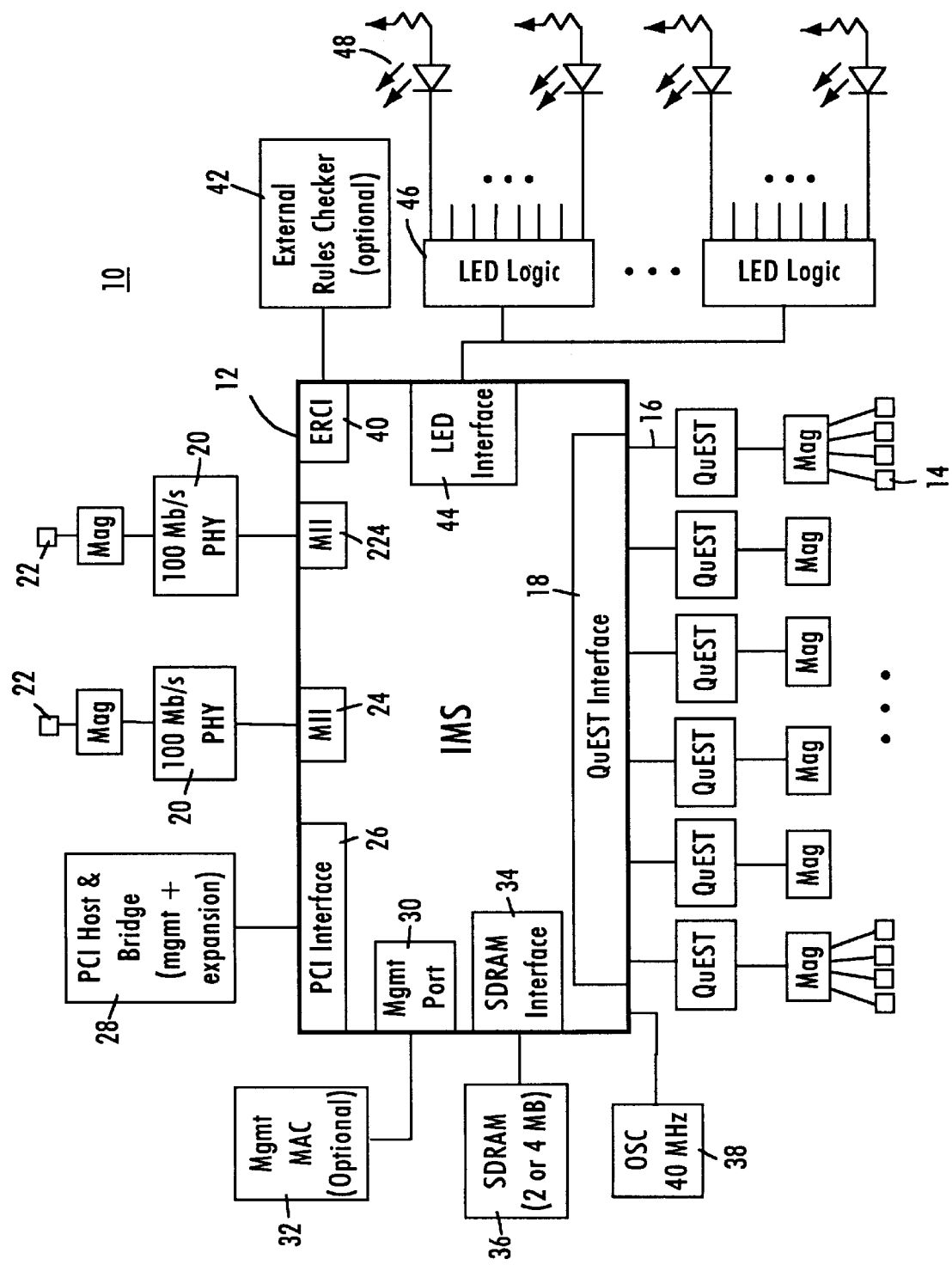
FIG. 1 is a block diagram of an exemplary system employing an embodiment of the present invention for driving a display.

FIG. 1 is a block diagram of an exemplary system in which the present invention may be advantageously employed. The exemplary system 10 is a packet switched network, such as an Ethernet network. A multiple port switch 12 ("multiport switch") contains a decision making engine, switching engine, buffer memory interface, configuration/control/status registers, management counters, and MAC (media access control) protocol interface for a group of ethernet ports. In the depicted embodiment, 24 10BASE-T ports 14 are connected to the multiport switch 12. This connection, in the exemplary embodiment, is made through switch transceivers 16. Each switch transceiver 16 has four independent 10 Mb\s twisted-pair ports. An exemplary device which may serve as the switch transceiver is the quad ethernet switch transceiver manufactured by AMD, for example. An advantage of the quad ethernet switch transceiver is that, although providing for independent 10 Mb\s 10BASE-T ports in each transceiver, data and control information for each of these four ports is time-division multiplexed over a single serial NRZ (non-return to zero) interface. This reduces the pin count of the switch 12, among other advantages. Each Ethernet switch transceiver 16 is coupled to the switch through an Ethernet switch transceiver interface 18.

In addition to the 10 Mb\s ports, the exemplary embodiment of the switch also has two 10 Mb\s physical (PHY) devices of type 100BASE-TX, 100 BASE-T4 or 100BASE-FX. These have reference numeral 20. Hence, stations 22 connected to the 100 Mb\s physical devices 20 may also be included in the system 10. A media independent interface (MII) 24 provides a connection to the 100 Mb\s physical devices 20.

A PCI (peripheral component interconnect) interface 26 on the switch 12 allows a PCI host processor 28 to: access the switch 12 and Ethernet switch transceiver interface 18 configuration/status registers; initialize and read counters in an external memory; manipulate frame data in an external memory; receive frames from user ports; and create and queue frames to user output ports. The PCI interface 26 is a PCI slave interface.

A management port 30 provides an interface with the switch 12 to an external MAC engine 32, this MAC engine 32 being able to then serve as a management agent.

An external memory interface 34 provides access to an external memory 36 that stores received frame data, memory structures and counters. Examples of suitable memory are 80, 100 or 120 MHz synchronous DRAMs. A suitable size DRAM is 2 or 4 Mbytes.

An oscillator 38 provides a 40 MHz clock input for system functions of the switch 12.

An external rules checker interface 40 allows the use of an external device to make frame forwarding decisions. An external rules checker 42, that makes the frame forwarding decisions, is coupled to the switch 12 through the external rules checker interface 40.

An LED interface 44 is used by the switch 12 to clock out the status of conditions per port and drive LED external logic 46. The LED external logic 46, in turn, drives LED display elements 48 that are human readable.

Figure 2:
FIG. 2 is a block diagram of a switch for a packet switched network, constructed in accordance with an embodiment of the present invention.
Figure 2A:
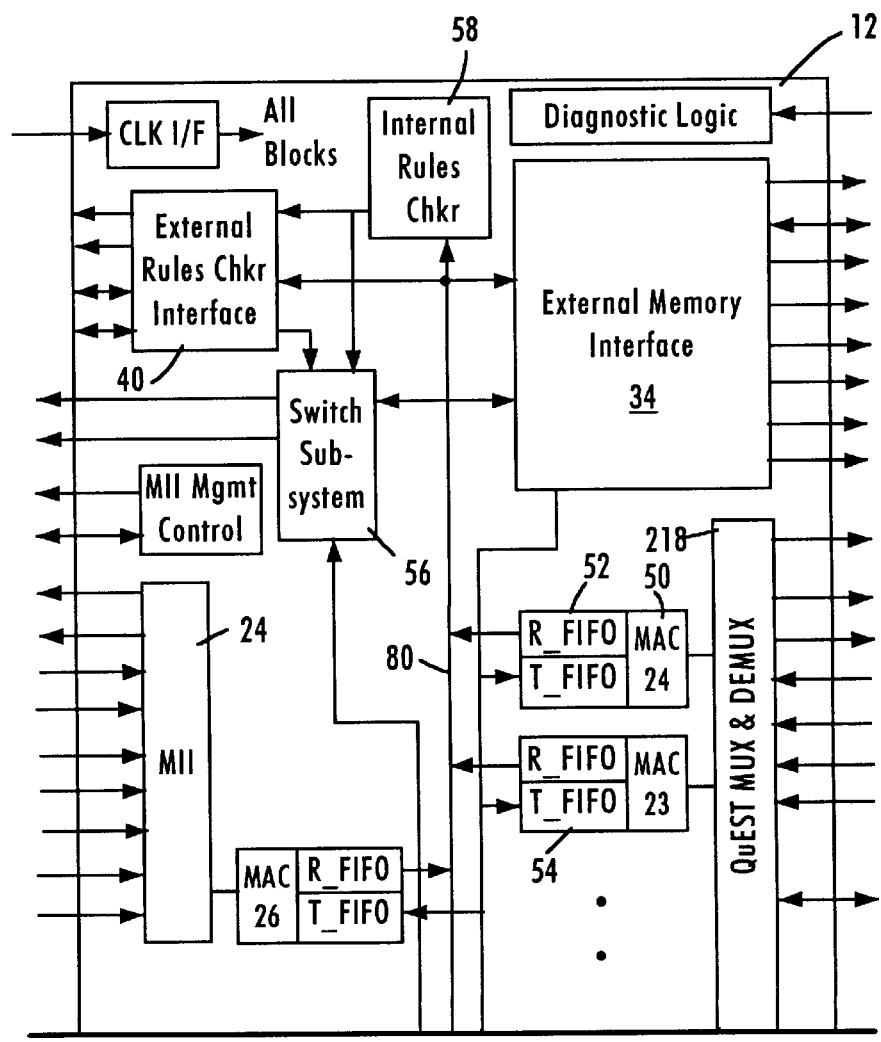
Figure 2B:
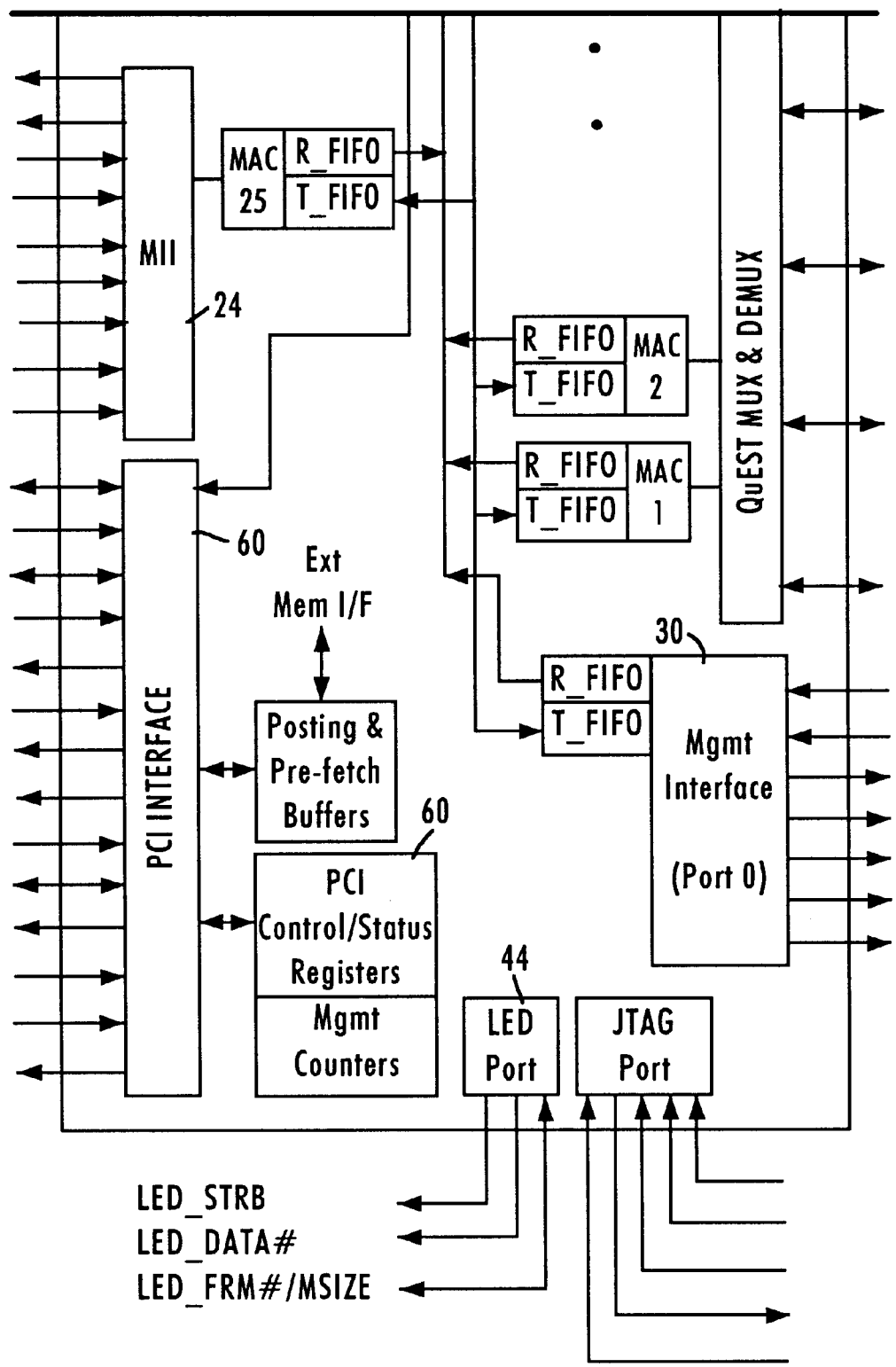

FIG. 2 is a block diagram of an exemplary embodiment of the switch 12 depicted in FIG. 1. The interfaces already described with respect to FIG. 1 will not be described again with respect to FIG. 2, except as necessary. Also, certain functional blocks appearing in FIG. 2 will not be described in detail since an understanding of these functional blocks is not necessary to understand the present invention.

In the exemplary embodiment of FIG. 2, each of the 26 ports (1–26) has a separate MAC 50 (media access controller), receive first-in first-out (FIFO) buffer 52 and transmit FIFO 54. A switch subsystem 56, in conjunction with the rules checker, either internal 58 or external (not illustrated), is employed to route data frames received at the switch 12 from a source port to the appropriate destination ports. Control and status registers 60 are used to configure the switch 12, its ports and external memory, and provide additional information about interrupts, tables, and the external physical devices, as well as providing diagnostic features. Although shown as a single block 60, the registers are distributed throughout the chip 12 in practice.

The LED interface 44 provides three signals, in certain preferred embodiments, to convey the LED status information to the external LED logic 46 and drive the LED display elements (48 in FIG. 1). The data is driven in a serial manner through the LED interface 44 into the LED logic 46 (see FIG. 1). These three signals, in the illustrated embodiment, include LED_DATA#, LED_STRB and LED_FRM#. These signals are depicted in FIG. 4. The LED_DATA# signal serially shifts out the status of all of the conditions which are identified in an LED configuration register (described later with respect to FIG. 5). The serial data stream contains a particular series of events for a given port, such as port 1 of 26 ports. This is followed by the subsequent series of events for the next port (port 2), and so on.

The LED_STRB signal clocks the LED_DATA# through an external register chain, described later. The LED_STRB signal goes low at the end of presenting all the LED_DATA# to the registers and remains low for a pulse-stretching period in order to allow the LEDs to become visible to the human eye.

The LED_FRM# signal is asserted throughout the strobing period. The polarity of LED_FRM# is programmable in the LED configuration register to provide the ability to control various types of enables on the output buffers.

The LED status indicators are based on any event that occurred for a specified condition during the preceding pulse-stretching period (e.g., 210 ms). In an exemplary embodiment, the status indicators are driven out on the LED data signal in the following order: all conditions for port 0, all conditions for port 1, all conditions for port 2, and so on. This is shown in Table I below. If a condition is not enabled in the LED configuration register, the LED data stream is reduced. For example, if only two conditions are enabled for each of the 10 Mb\s and 100 Mb\s ports (14, 22), the LED_DATA# and LED_FRM# signals will consist of 52 pulses.

TABLE I

| Port Number | Condition Indication |
| --- | --- |
| 10 Mb/s Port #1 | Activity, Receive, Transmit, Collision; Link Status, Full Duplex |
| 10 Mb/s Port #2 | Activity, Receive, Transmit, Collision, Link Status, Full Duplex |
| 10 Mb/s Port #24 | Activity, Receive, Transmit, Collision, Link Status, Full Duplex |
| . | . |
| . | . |

TABLE I-continued

| Port Number | Condition Indication |
| --- | --- |
| . | . |
| 100 Mb/s Port #25 | Activity, Receive, Transmit, Collision, Link Status, Full Duplex |
| 100 Mb/s Port #26 | Activity, Receive, Transmit, Collision, Link Status, Full Duplex |

For use as the LED configuration register, which is programmable to store the conditions for which the status will be displayed, one of the registers 60 (FIG. 2) that is programmable by a host is employed. In addition to being able to select which conditions will be driven out for each port, the host is also able to configure which ports will have status information displayed. Hence, the user is able to program which ports will have status information displayed, as well as for which conditions from the plurality of possible conditions. In the exemplary embodiment of the LED configuration register of FIG. 5, the selection of the ports is limited to enabling of the 24 10 Mb\s user ports and/or the 100 Mb\s ports.

Referring to FIG. 5, the ENTENLED10 bit is used to enable the LED data output for the 10 Mb\s user ports. Bits 1–7 specify which conditions will be strobed out for each of the 10 Mb\s user ports. For example, bit 1 is an ACTLED10 bit that strobes out the LED data for activity ACT (TX or RX) on all 10 Mb\s ports. (This also includes the port 0 management port.) The remaining types of conditions that are selectable include receive, transmit, collision, link status, and full-duplex.

Bits 8–15 are reserved, and bit 16 serves as an enable LED data output for 100 Mb\s ports. Hence, setting this bit causes LED data for the 100 Mb\s ports to be strobed out. The conditions for which status will be strobed out for the 100 Mb\s ports is independently programmable from the enabled conditions of the 10 Mb\s ports. Bits 17–23 of the LED configuration register specify which of these conditions will have their status strobed out.

The host configures which conditions and ports have status information latched out of the switch 12. The user will, through the host, program the LED configuration register of FIG. 5 to select which conditions will be strobed out for which ports. For example, one particular user may be most interested in seeing the status of the activity and collision conditions for all of the ports. Accordingly, the user will set the LED configuration register with bits 0, 1, 4, 16, 17 and 20 set.

Figure 6:
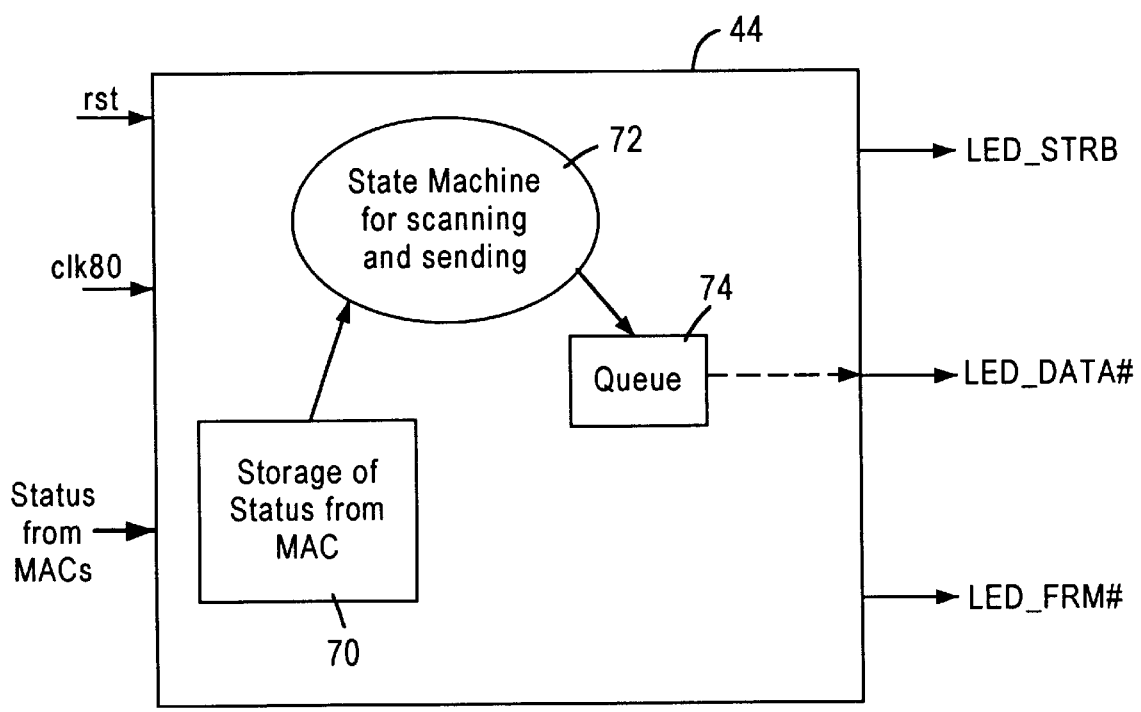
FIG. 6 depicts a block diagram of an LED interface employed in the switch of FIG. 2, constructed in accordance with an embodiment of the present invention.

Once the configuration has been stored in the LED configuration register, the LED interface 44 will use the stored configuration to retrieve from the memory the status for only those conditions identified by the stored display configuration. As depicted in FIG. 6, the LED interface 44 has a storage area 70 (or memory), a state machine 72 for scanning and sending, and a queue 74 that queues the data which forms the LED data signal. The memory 70 may conceptually be considered to be configured with 26 rows, representing 26 ports, and six columns, each column representing a different one of the conditions, such as activity, receive, transmit, etc. The memory 70 in the LED interface 44 continuously receives status from the MACs 50 of all six conditions during operation of the system and the switch 12. The status is placed or updated in the appropriate row (port) and column (condition). The status information for each of the ports 1–26 contained in the memory 70 is therefore constantly being updated. However, although the status for all of the conditions for all of the ports are stored in the memory 70, the state machine 72 will retrieve the status for only those conditions and those ports that are enabled in the LED configuration register.

Figure 7:
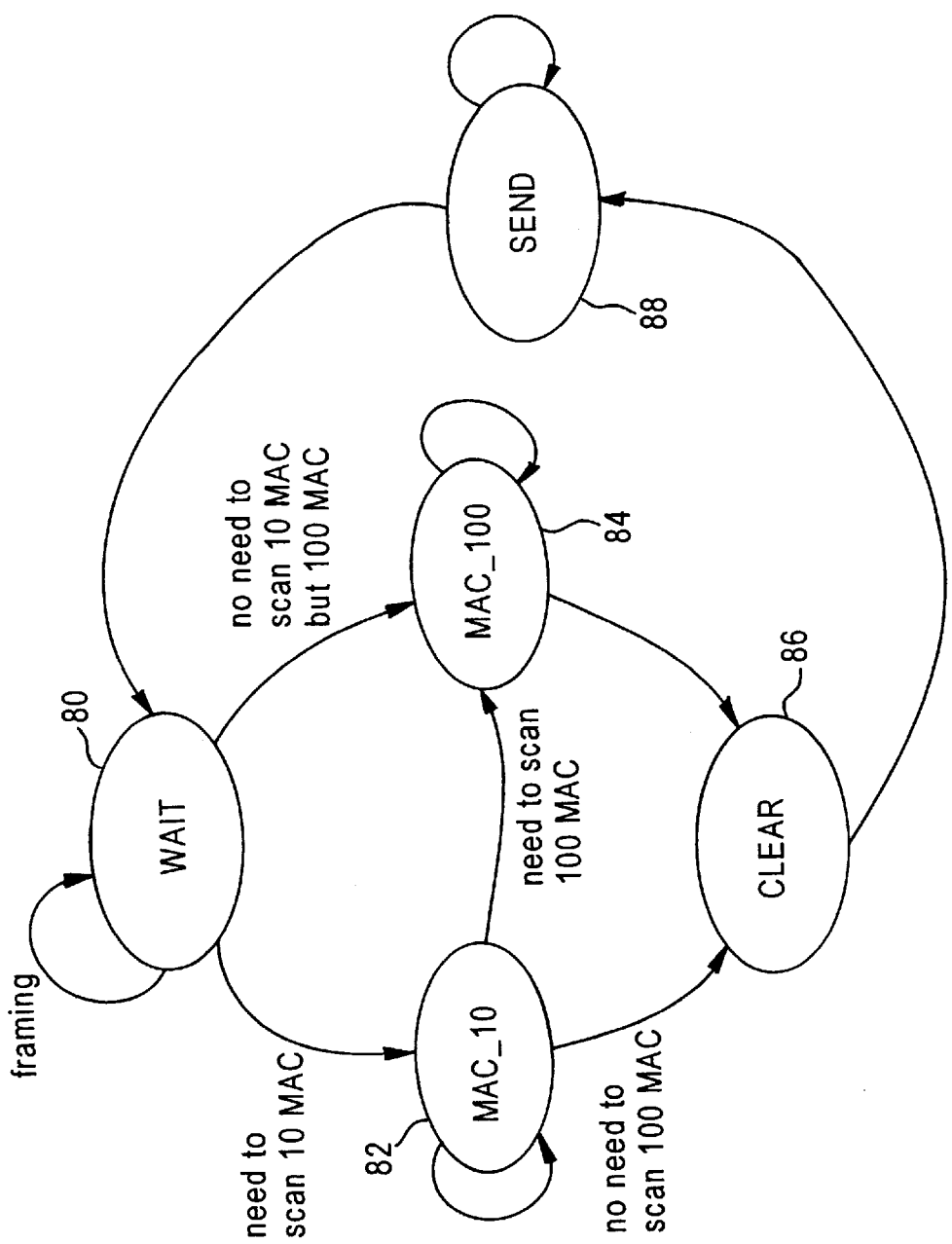
FIG. 7 depicts an exemplary embodiment of an LED state machine employed in the LED interface of FIG. 6.
Figure 8:
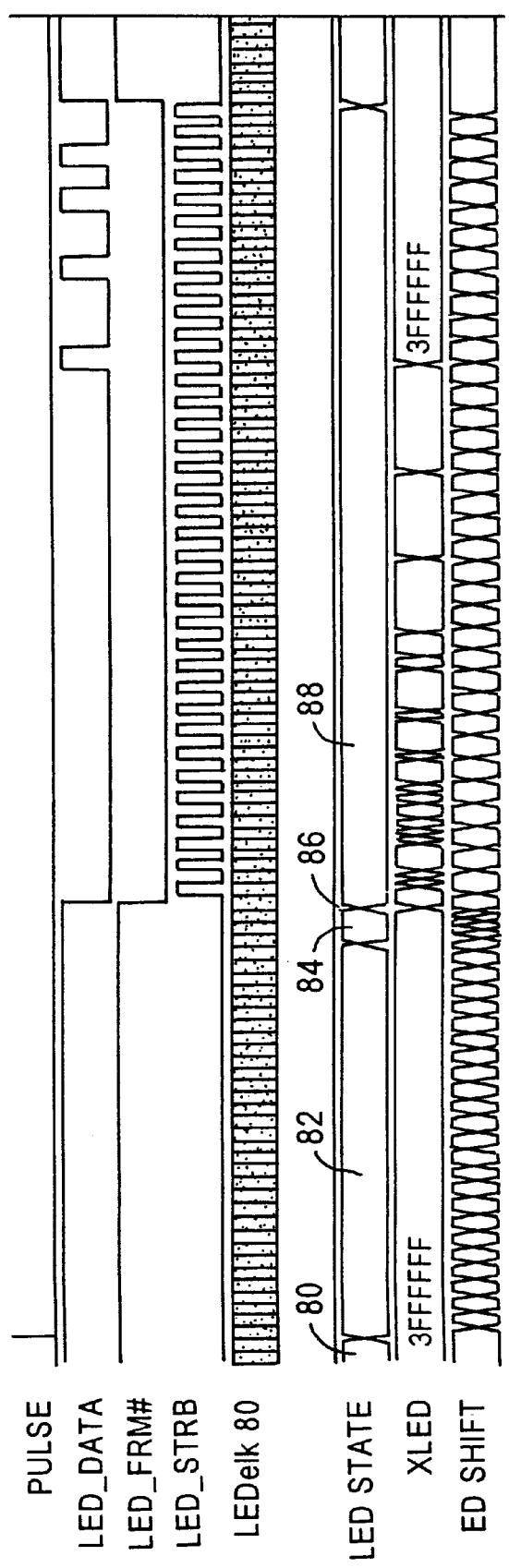
FIG. 8 is an exemplary timing diagram of the method of the present invention.

An exemplary embodiment of the LED state machine in provided in FIG. 7. An exemplary timing diagram, with corresponding numbers for the states, is provided in FIG. 8. Depicted in the timing diagram of FIG. 8 is the pulse signal, the LED_DATA# signal, the LED_FRM# signal, the LED_STRB signal, the LED clock, the LED state, the transmit TXLED signal, and the LED shift signal. The LED state machine 72 is first in a wait state 80, and in response to a pulse, enters state 82 to scan the programmed conditions for the 10 Mb\s ports. This assumes that the 10 Mb\s ports are selected (enabled) in the LED configuration register. The checking of the enable bit is indicated by the arrow in FIG. 7 that states "need to scan 10 MAC". The scanning of the 10 Mb\s ports is performed by reading from the memory 70 each enabled condition, row by row, corresponding to port by port. The status for each of the enabled conditions, for each of the enabled ports, is provided to the queue 74 by the state machine 72. The queue 74 assembles the data which is eventually provided in a burst fashion in the LED_DATA# signal.

Upon completion of the retrieval of the status for the enable conditions for the 10 Mb\s ports, it is next determined whether there is a need to scan the 100 Mb\s ports. This is determined by the enable bit for the 100 Mb\s ports contained in the stored display configuration within the LED configuration register of FIG. 5. If the enable bit is not set, there is no need to scan the 100 Mb\s ports, and the LED state machine 72 proceeds to state 86, a clear state. Assuming, however, that the enable bit is set, the status for the conditions of the 100 Mb\s ports are retrieved from the memory 70 in state 84. As for the 10 Mb\s ports, this retrieval from the memory 70 involves reading the status only for the enabled conditions for the 100 Mb\s ports. The retrieved status is provided to the queue 74.

Once the scanning is completed for all of the enabled ports, the memory 70 is cleared in state 86. This allows the data to be kept current for the next scanning interval. After the clearing of the memory 70 in state 86, the LED state machine 72 enters state 88 in which the data is collected in the queue 74 sent in a burst manner as the LED_DATA# signal.

An exemplary implementation of the LED external logic 46 is depicted in FIG. 3. The inputs to the external logic 46 are the LED_DATA#, LED-STRB, LED_FRM# signals. In the example depicted in FIG. 3, the status for two different conditions per port, the activity and collision status, are presented for display. It is assumed that these conditions were programmed in the LED configuration register of FIG. 5 by a user or manager. In certain advantageous embodiments, all of the enabled conditions for a particular port appear in the LED_DATA# signal, followed by all conditions for the next port. This assists with the printed circuit board signal trace layout considerations.

The LED external logic 46, in the exemplary embodiment, employs a plurality of octal shift registers 90, such as the 74LS164, and octal D-type flip-flops 92. In this embodiment, in which the status for two conditions for each of the 26 ports are provided, 52 LEDs are employed to display the status of these two conditions. The D-type flip-flops, reference numeral 92, may be 74LS374 flip-flops, for example.

In operation, the LED_DATA# signal is supplied to the shift registers 90 and clocked through these registers 90 by the LED_STRB signal. Following the loading of each of the shift registers 90 with the data, LED_FRM# signal is asserted to cause the data at the output of the D-type flip-flops 92 to remain stable for a period of time so as to be human readable. The use of a dual-tier system, and the LED_FRM# signal, avoids LED flickering which would be visible to the human eye, which is possible if the LEDs 48 were driven directly from the octal shift registers 90. This flickering may be especially noticeable when a large number of conditions per port are driven. However, implementations of the invention with direct connections of the LEDs 48 to the octal shift registers 90, as well as implementations in which flip-flops 92 are employed, are both used in different embodiments of the present invention.

The present invention has been described in the context of a multiport switch employed in a packet-switched network. However, as is readily apparent from the description to one of ordinary skill in the art, the present invention may also be employed in other devices in which a plurality of conditions of the system are present and the status is collected for these conditions. The present invention is advantageous in that it provides for retrieving and displaying the status of only a programmed subset of conditions. This allows customization of the display to show the status of only those conditions in which the user or manager is interested, while providing users with the possibility of obtaining the status of a large number of different conditions. The present invention also reduces the number of display elements needed, since only a subset of the conditions will be displayed.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. For a network switch having n plurality of first type ports and x plurality of second type ports, different from the first type ports, with each first type port having m plurality of conditions and each second type port having y plurality of conditions, a method of driving a display having a plurality of discrete display elements to display a status of j<m conditions of each first type port and a status of k<y conditions of each second type port, the status of each of the m and y plurality of conditions being represented by a single bit, comprising the steps of:

storing in a memory of the network switch the status of each of the m and y plurality of conditions of each of the n plurality of first type ports and each of the x plurality of second type ports;

storing a display configuration identifying the j conditions of each first type port and the k conditions of each second type port the status of which are to be displayed;

retrieving from the memory the status of the j conditions of each first type port and the k conditions of each second type port identified by the stored display configuration; and driving the individual display elements to respectively display the status of each of the j conditions for each respective first type port and the status of each of the k conditions for each respective second type port.

2. The method of claim 1, wherein the step of retrieving includes serially shifting the status for the identified j and k conditions from the memory into a shift register.

3. The method of claim 2, wherein
the step of retrieving further includes latching in parallel the status for the identified j and k conditions from the shift register to a set of latches following loading of the shift register with the status for the identified j and k conditions; and the step of driving includes driving the individual display elements with the status latched in the set of latches.

4. The method of claim 1, wherein the individual display elements are light-emitting diodes (LEDs), each LED being one either energized or not energized to represent the status each of the m and y plurality of conditions.

5. For a network switch having n plurality of first type ports and x plurality of second type ports, different from the first type ports, with each first type port having m plurality of conditions and each second type port having y plurality of conditions, a method of displaying a status of j<m conditions of each first type port and a status of k<y conditions of each second type port, the status of each of the m and y plurality of conditions being represented by a single bit, comprising the steps of:

storing in a memory of the network switch the status of each of the m and y plurality of conditions of each of the n plurality of first type ports and each of the x plurality of second type ports;

storing in a configurable storage area the j conditions of each first type port and the k conditions of each second type port, the status of which are to be displayed;

retrieving from the memory the status of the j conditions of each first type port and the k conditions of each second type port stored in the configurable storage area; and displaying the retrieved status information for each respective first type port and each respective second type port.

6. The method of claim 5, wherein the network switch includes a light-emitting diode (LED) display driver circuit, and the step of displaying the retrieved status information includes generating a separate LED driver signal for driving an individual LED, each LED driver signal corresponding to the status of a respective one of the j and k conditions of a corresponding port.

7. The method of claim 6, wherein the step of storing in a memory of the network switch includes storing the status of each of the m and y plurality of conditions of each of the n plurality of first type ports and each of the x plurality of second type ports in matrix form where each respective first type and second type port is represented by one row/column each respective m and y condition is represented by a column/row.

8. The method of claim 7, wherein the step of generating a separate LED driver signal includes generating a serial burst data signal representing all of the status retrieved from the memory for each of the the j conditions of each first type port and the k conditions of each second type port store in the configurable storage area.

9. The method of claim 8, wherein the step of displaying further includes clocking the serial burst data signal into a register.

10. The method of claim 9, wherein the step of displaying further includes latching the data from the register into output latches following loading of a complete serial burst data signal into the register, each of the output latches having an LED driver output at which the LED driver signal is present upon latching of the data from the register.

11. A multiport switch that displays status information of a plurality of conditions associated with respective ports in a packet switched system, the switch comprising:

n plurality of first type ports and x plurality of second type ports, different from the first type ports, each first type port having m plurality of conditions associated therewith and each second type port having y plurality of conditions associated therewith, the status of each of the m and y plurality of conditions being represented by a single bit;

a memory storing the status of each of the m and y plurality of conditions of each of the n plurality of first type ports and each of the x plurality of second type ports;

a register programmable to store a display configuration identifying the j conditions of each first type port and the k conditions of each second type port the status of which are to be displayed; and a state machine that collects the status of the j conditions of each first type port and the k conditions of each second type port identified by the stored display configuration and generates an output data signal comprising the collected status.

12. The switch of claim 11, further comprising a queue that receives the output data signal from the state machine and produces a burst data output signal.

13. The switch of claim 12, wherein the status of each condition comprising the burst data output signal forms a light-emitting diode (LED) display signal for driving an individual LED display element.

14. The switch of claim 11, wherein the packet switched system is an Ethernet network.

15. A packet switched system comprising:

a plurality of end stations; and a multiport switch coupled to the end stations through switch ports, the multiport switch including n plurality of first type ports and x plurality of second type ports, different from the first type ports, each first type port having m plurality of conditions associated therewith and each second type port having y plurality of conditions associated therewith, the status of each of the m and y plurality of conditions being represented by a single bit;

a memory storing the status of each of the m and y plurality of conditions of each of the n plurality of first type ports and each of the x plurality of second type ports;

a register programmable to store a display configuration identifying the j conditions of each first type port and the k conditions of each second type port the status of which are to be displayed;

a display interface with a state machine that collects the status of the j conditions of each first type port and the k conditions of each second type port identified by the stored display configuration and generates an output data signal comprising the collected status; and a multiple element display coupled to the display interface to receive the output data signal and generate a display of the status of the j conditions of each first type port and the k conditions of each second type port identified by the stored display configuration.

16. The system of claim 15, wherein the multiport switch further includes a queue that receives the output data signal from the state machine and produces a burst data output signal.

17. The system of claim 16, wherein the multiple element display comprises individual light-emitting diodes (LEDs) and the status of each condition comprising the burst data output signal forms an LED display signal for driving an individual LED of the multiple element display.

18. The system of claim 15, wherein the packet switched system is an Ethernet network.

19. The system of claim 17, further comprising light-emitting diode (LED) external logic coupled between the multiport switch and the multiple element display, the LED external logic receiving the burst data output signal and driving the multiple element display in accordance with the burst data output signal.

20. The system of claim 19, wherein the LED external logic includes a shift register that receives the burst data output signal and a strobe signal generated by the display interface to shift the burst data output signal into the shift register.

21. The system of claim 20, wherein the shift register includes a plurality of latches, and the individual LEDs are respectively coupled to the outputs of the latches and are driven by signals present at the outputs of the latches.

22. The system of claim 20, wherein the LED external logic includes a plurality of flip-flops coupled in parallel to the shift register, the LED external logic being responsive to a frame signal generated by the display interface to load and hold stable in the flip-flops the burst data output signal from the shift register, and wherein the individual LEDs are respectively coupled to the outputs of the flip-flops and are driven by signals present at the outputs of the flip-flops.

\* \* \* \* \*